(12) United States Patent
Ou

(10) Patent No.: US 12,256,613 B2
(45) Date of Patent: Mar. 18, 2025

(54) DISPLAY SUBSTRATE, METHOD FOR FABRICATING SAME, AND VAPOR DEPOSITION APPARATUS

(71) Applicant: GUANGZHOU CHINA STAR OPTOELECTRONICS SEMICONDUCTOR DISPLAY TECHNOLOGY CO., LTD., Guangdong (CN)

(72) Inventor: Jianbing Ou, Guangdong (CN)

(73) Assignee: GUANGZHOU CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/755,864

(22) PCT Filed: Apr. 20, 2022

(86) PCT No.: PCT/CN2022/087909
§ 371 (c)(1),
(2) Date: May 10, 2022

(87) PCT Pub. No.: WO2023/193300
PCT Pub. Date: Oct. 12, 2023

(65) Prior Publication Data
US 2024/0155888 A1 May 9, 2024

(30) Foreign Application Priority Data
Apr. 7, 2022 (CN) .......................... 202210364255.0

(51) Int. Cl.
*H10K 59/131* (2023.01)
*C23C 14/04* (2006.01)
(Continued)

(52) U.S. Cl.
CPC ......... *H10K 59/131* (2023.02); *C23C 14/042* (2013.01); *C23C 14/24* (2013.01);
(Continued)

(58) Field of Classification Search
CPC ............... H10K 59/131; H10K 59/135; H10K 59/80521; H10K 50/822; H10K 71/164;
(Continued)

(56) References Cited

U.S. PATENT DOCUMENTS

2015/0311477 A1* 10/2015 Cho ........................ H10K 59/40
257/40
2017/0271420 A1* 9/2017 Tsai ...................... H10K 59/122
(Continued)

FOREIGN PATENT DOCUMENTS

CN 102082238 A * 6/2011 ............. H01L 27/32
CN 103781935 A * 5/2014 ............. C23C 10/04
(Continued)

OTHER PUBLICATIONS

Machine translation, Written Opinion of the International Searching Authority, International Searching Authority, International application No. PCT/CN2022/087909, Google translation, all pages. (Year: 2023).*

(Continued)

*Primary Examiner* — Victoria K. Hall
(74) *Attorney, Agent, or Firm* — PV IP PC; Wei Te Chung

(57) ABSTRACT

A display substrate, a method for fabricating the same, and a vapor deposition apparatus are provided. The display substrate comprises two first overlapping areas, and further comprises a light-emitting functional layer and an electrode layer. The light-emitting functional layer comprises two second portions respectively located in the two first overlapping areas and each comprising a plurality of first blocks.

(Continued)

The electrode layer comprises two fourth portions respectively located in the two first overlapping areas and each comprising a plurality of second blocks. In one same first overlapping area, each of the first blocks does not overlap at least partially with one of the second blocks.

20 Claims, 5 Drawing Sheets

(51) Int. Cl.
*C23C 14/24* (2006.01)
*H10K 50/822* (2023.01)
*H10K 59/12* (2023.01)
*H10K 59/80* (2023.01)
*H10K 71/00* (2023.01)
*H10K 71/16* (2023.01)
*H10K 71/60* (2023.01)

(52) U.S. Cl.
CPC ....... *H10K 50/822* (2023.02); *H10K 59/1201* (2023.02); *H10K 59/80521* (2023.02); *H10K 71/164* (2023.02); *H10K 71/166* (2023.02); *H10K 71/60* (2023.02); *H10K 71/621* (2023.02)

(58) Field of Classification Search
CPC .... H10K 71/166; H10K 71/60; H10K 71/621; C23C 14/042
See application file for complete search history.

(56) References Cited

U.S. PATENT DOCUMENTS

| | | | |
|---|---|---|---|
| 2019/0074343 A1* | 3/2019 | Haas | H10K 71/621 |
| 2019/0280240 A1* | 9/2019 | Chen | H10K 59/1315 |
| 2021/0159291 A1* | 5/2021 | Kim | H10K 71/166 |
| 2022/0238614 A1* | 7/2022 | Luo | H10K 59/80524 |
| 2023/0157095 A1* | 5/2023 | Xu | H10K 59/80522 257/40 |

FOREIGN PATENT DOCUMENTS

| | | | | | |
|---|---|---|---|---|---|
| CN | 109136833 A | * | 1/2019 | ........... | C23C 14/042 |
| CN | 110611054 A | * | 12/2019 | ............. | H10K 50/82 |

OTHER PUBLICATIONS

Written Opinion of the International Searching Authority, International Searching Authority, International application No. PCT/CN2022/087909, all pages. (Year: 2023).*
Machine translation, Qiu, Chinese Pat. Pub. No. CN-102082238-A, translation date: Aug. 23, 2024, Clarivate Analytics, all pages. (Year: 2024).*
Machine translation, Xin, Chinese Pat. Pub. No. CN-109136833-A, translation date: Aug. 23, 2024, Clarivate Analytics, all pages. (Year: 2024).*
Machine translation, Hanika, Chinese Pat. Pub. No. CN-103781935-A, translation date: Aug. 23, 2024, Clarivate Analytics, all pages. (Year: 2024).*
Machine translation, Zhou, Chinese Pat. Pub. No. CN-110611054-A, translation date: Aug. 23, 2024, Clarivate Analytics, all pages. (Year: 2024).*

* cited by examiner

DISPLAY SUBSTRATE, METHOD FOR FABRICATING SAME, AND VAPOR DEPOSITION APPARATUS

FIELD OF INVENTION

The present disclosure relates to the technical field of display, and particularly to a display substrate, a method for fabricating the same, and a vapor deposition apparatus.

BACKGROUND

With continuous advancement of science and technology, people have higher requirements for quality of display devices. Organic light-emitting diode (OLED) display screens have advantages of self-luminescence, wide viewing angle, low power consumption, and fast response time, and are gradually being widely used.

An OLED display screen comprises a light-emitting functional layer and a cathode layer stacked on the light-emitting functional layer. The light-emitting functional layer and the cathode layer are generally formed by vapor deposition. In order to realize a display function, both the light-emitting functional layer and the cathode layer need to be disposed in a display area of the OLED display screen. Furthermore, because the cathode layer also needs to be overlapped with an external circuit to access electrical signals, the cathode layer also needs to be disposed in an overlapping area surrounding the display area of the OLED display screen. Therefore, vapor deposition processes of the light-emitting functional layer and the cathode layer require masks of different sizes and a series of corresponding cavities to meet process requirements, which greatly increases a fabricating cost of the OLED display screen. This problem needs to be solved urgently.

SUMMARY OF DISCLOSURE

The present disclosure provides a display substrate, a method for fabricating the same, and a vapor deposition apparatus, wherein a light-emitting functional layer and a cathode layer can be vapor deposited by using one same mask, which greatly reduces a fabricating cost of the display substrate.

In order to achieve the above purpose, the display substrate, the method for fabricating the same, and the vapor deposition apparatus of the present disclosure adopt the following technical solutions.

The present disclosure provides a display substrate. The display substrate comprises a display area and an overlapping area surrounding the display area, and further comprises a base substrate and a light-emitting functional layer and an electrode layer stacked on the base substrate. The overlapping area comprises two first overlapping areas. The two first overlapping areas extend in a first direction and are respectively located at opposite sides of the display area. Each of the first overlapping areas is provided with a plurality of signal wires. The light-emitting functional layer comprises a first portion located in the display area and two second portions respectively located in the two first overlapping areas. Each of the second portions comprises a plurality of first blocks spaced in the first direction. Each of the first blocks is connected to the first portion. The electrode layer comprises a third portion located in the display area and two fourth portions respectively located in the two first overlapping areas. Each of the fourth portions comprises a plurality of second blocks spaced in the first direction. Each of the second blocks is connected to the third portion. In one same first overlapping area, an orthographic projection of each of the first blocks on the base substrate does not overlap at least partially with an orthographic projection of one of the second blocks on the base substrate, and each of the second blocks corresponds to and is electrically connected to an end of one of the signal wires.

Optionally, in the same first overlapping area, an area of the orthographic projection of each of the first blocks on the base substrate is same as an area of the orthographic projection of one of the second blocks on the base substrate, and the number of the first blocks is same as the number of the second blocks.

Optionally, the first blocks in one of the first overlapping areas are symmetrical to the first blocks in the other first overlapping area, and the second blocks in one of the first overlapping areas are symmetrical to the second blocks in the other first overlapping area.

Optionally, in the same first overlapping area, a distance between two adjacent first blocks is a, a distance between two adjacent second blocks is a, a width of each of the first blocks in the first direction is b, and a width of each of the second blocks in the first direction is b. An orthographic projection of each of the second blocks on the light-emitting functional layer covers a gap between two adjacent first blocks, and $b \geq a > 0$.

Optionally, the overlapping area further comprises two second overlapping areas. The two second overlapping areas extend in a second direction and are respectively located at other opposite sides of the display area. The light-emitting functional layer further comprises a fifth portion corresponding to one second overlapping area and connected to the first portion. The electrode layer further comprises a sixth portion corresponding to one second overlapping area and connected to the third portion. The fifth portion and the sixth portion are respectively located in different second overlapping areas. The first direction is perpendicular to the second direction.

In another aspect, the present disclosure further provides a vapor deposition apparatus. The vapor deposition apparatus comprises a carrier table and a mask. The carrier table is configured to carry a display substrate. The display substrate comprises a display area and an overlapping area surrounding the display area. The overlapping area comprises two first overlapping areas. The two first overlapping areas extend in a first direction and are respectively located at opposite sides of the display area. Each of the first overlapping areas is provided with a plurality of signal wires. The mask is located above the display substrate and is capable of moving in the first direction relative to the display substrate. The mask comprises a solid portion and a hollow portion. The hollow portion comprises a first hollow portion and a plurality of second hollow portions spaced in the first direction on opposite sides of the first hollow portion. Each of the second hollow portions communicates with the first hollow portion. The mask has a first state before moving and a second state after moving. In the first state and the second state, an orthographic projection of the first hollow portion on the display substrate always covers the display area, and an orthographic projection of the second hollow portions on the display substrate is always located in the first overlapping areas. The orthographic projection of the second hollow portions on the display substrate in the second state does not overlap at least partially with the orthographic projection of the second hollow portions on the display substrate in the first state.

Optionally, the second hollow portions in one of the first overlapping areas are symmetrical to the second hollow portions in the other first overlapping area.

Optionally, in one same first overlapping area, the second hollow portions are arranged at equal intervals.

Optionally, in the same first overlapping area, a distance between two adjacent second hollow portions is a, a width of each of the second hollow portions in the first direction is b, a moving distance of the mask relative to the display substrate in the first direction in the second state is equal to a, and b>a>0.

Optionally, in the same first overlapping area, a distance between two adjacent second hollow portions is a, a width of each of the second hollow portions in the first direction is b, a moving distance of the mask relative to the display substrate in the first direction in the second state is equal to b, and 0<b≤a.

Optionally, the overlapping area further comprises two second overlapping areas, the two second overlapping areas extend in a second direction and are respectively located at other opposite sides of the display area, a width of the first hollow portion in the first direction is c, a width of the display area in the first direction is e, a difference between c and e is equal to the moving distance of the mask relative to the display substrate in the first direction in the second state, and c>e>0.

In yet another aspect, the present disclosure further provides a method for fabricating a display substrate, which comprises:

providing a vapor deposition apparatus, wherein the vapor deposition apparatus comprises a carrier table and a mask, the mask comprises a solid portion and a hollow portion, the hollow portion comprises a first hollow portion and a plurality of second hollow portions spaced in a first direction on opposite sides of the first hollow portion, and each of the second hollow portions communicates with the first hollow portion;

disposing a display substrate on the carrier table, wherein the display substrate comprises a display area and an overlapping area surrounding the display area, the overlapping area comprises two first overlapping areas, the two first overlapping areas extend in the first direction and are respectively located at opposite sides of the display area, and each of the first overlapping areas is provided with a plurality of signal wires;

disposing the mask above the display substrate, adjusting the mask to a first state, and forming a patterned light-emitting functional layer on the display substrate by using the mask, wherein in the first state, an orthographic projection of the first hollow portion on the display substrate covers the display area, and an orthographic projection of the second hollow portions on the display substrate is located in the first overlapping areas;

moving the mask in the first direction relative to the display substrate to adjust the mask from the first state to a second state, and forming a patterned electrode layer on the display substrate by using the mask, wherein in the second state, an orthographic projection of the first hollow portion on the display substrate covers the display area, and an orthographic projection of the second hollow portions on the display substrate is located in the first overlapping areas, and the orthographic projection of the second hollow portions on the display substrate in the second state does not overlap at least partially with the orthographic projection of the second hollow portions on the display substrate in the first state.

The present disclosure provides a display substrate, a method for fabricating the same, and a vapor deposition apparatus. A light-emitting functional layer and a cathode layer of the display substrate can be fabricated by the vapor deposition apparatus using one same mask, and an electrode layer in a display area normally overlaps signal wires in first overlapping areas, which greatly reduces a fabricating cost of the display substrate.

BRIEF DESCRIPTION OF DRAWINGS

In order to more clearly illustrate technical solutions in embodiments of the present disclosure, a brief description of accompanying drawings used in a description of the embodiments will be given below. Obviously, the accompanying drawings in the following description are merely some embodiments of the present disclosure. For those skilled in the art, other drawings may be obtained from these accompanying drawings without creative labor.

DETAILED DESCRIPTION

Figure 1:
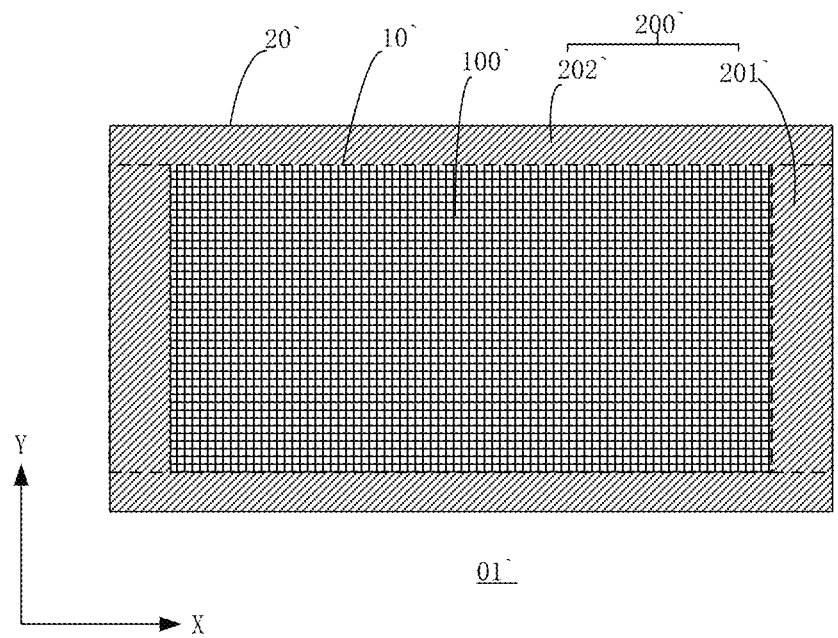
FIG. 1 is a bottom view of a light-emitting functional layer and an electrode layer of a display substrate in the prior art.

Technical solutions in embodiments of the present disclosure will be clearly and completely described below in conjunction with accompanying drawings in the embodiments of the present disclosure. It is apparent that the described embodiments are merely a part of the embodiments of the present disclosure and not all embodiments. All other embodiments obtained by those skilled in the art based on the embodiments of the present disclosure without creative labor are within claimed scope of the present disclosure. In addition, it should be understood that specific embodiments described herein are only used to illustrate and explain the present invention, and are not used to limit the present invention. In the present disclosure, unless otherwise stated, directional terms used herein specifically indicate directions of the accompanying drawings. For example, directional terms "upper" and "lower" generally refer to upper and lower positions of a device in actual use or working conditions, and directional terms "inside" and "outside" refer to positions relative to a profile of the device.

The following description provides different embodiments or examples illustrating various structures of the present invention. In order to simplify the description of the present disclosure, only components and settings of specific examples are described below. They are only examples and are not intended to limit the present invention. Furthermore, reference numerals and/or letters may be repeated in different examples of the present disclosure. Such repetitions are for simplicity and clarity, which per se do not indicate relations among the discussed embodiments and/or settings. Furthermore, the present disclosure provides various examples of specific processes and materials, but those skilled in the art can be aware of application of other processes and/or use of other materials. Details are as follows. It should be noted that a description order of the following embodiments is not intended to limit a preferred order of the embodiments.

FIG. 1 is a bottom view of a light-emitting functional layer and an electrode layer of a display substrate in the prior art. As shown in FIG. 1, a conventional display substrate 01' comprises a light-emitting functional layer 10' and an electrode layer 20' covering the light-emitting functional layer 10'. The light-emitting functional layer 10' is configured to perform a display function and is insulating. The electrode layer 20' is configured to cooperate with another electrode (not shown) located under the light-emitting functional layer 10' to form an electric field, so as to drive the light-emitting functional layer 10' to emit light. The electrode layer 20' is conductive. The display substrate 01' comprises a display area 100' and an overlapping area 200' disposed around the display area 100'. The display area 100' is provided with the light-emitting functional layer 10' and the electrode layer 20'. The overlapping area 200' comprises two first overlapping areas 201' extending in a first direction Y and arranged oppositely, and two second overlapping areas 202' extending in a second direction X and arranged oppositely. The two first overlapping areas 201' are provided with a plurality of signal wires (not shown) for transmitting electrical signals. In the display substrate 01', the electrical signals are uniformly transmitted to the electrode layer 20' in the display area 100' through the signal wires, so that any part of the electrode layer 20' in the display area 100' has a fixed potential. Correspondingly, the two first overlapping areas 201' also need to be provided with the electrode layer 20', so as to realize overlapping connection between the electrode layer 20' in the display area 100' and the signal wires. That is, in order to enable the display substrate 01' to perform a display function normally, the light-emitting functional layer 10' and the electrode layer 20' need to be disposed in the display area 100', and the electrode layer 20' also needs to be disposed in the two first overlapping areas 201. Therefore, in a process of fabricating the light-emitting functional layer 10' and the electrode layer 20' in the prior art, it is necessary to use two masks, one large and one small, and two corresponding vapor deposition apparatuses, which complicates the process and greatly increases cost.

The present disclosure provides a display substrate, a method for fabricating the same, and a vapor deposition apparatus. A light-emitting functional layer and a cathode layer of the display substrate can be fabricated by the vapor deposition apparatus using one same mask, and an electrode layer in a display area normally overlaps signal wires in first overlapping areas, which greatly reduces a fabricating cost of the display substrate.

First Embodiment

Figure 2:
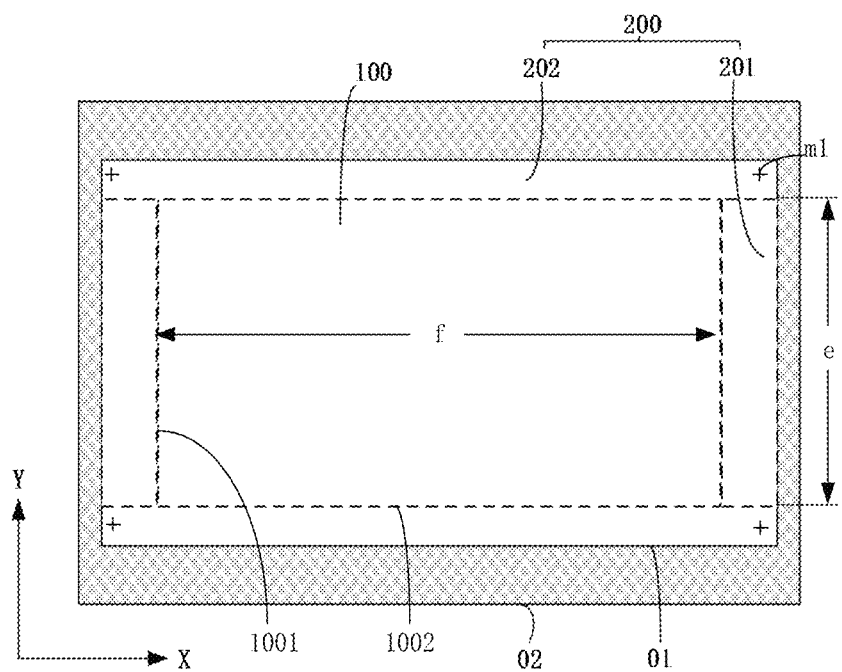
FIG. 2 is a top view of a display area and an overlapping area of a display substrate on a carrier table according to an embodiment of the present disclosure.
Figure 3:
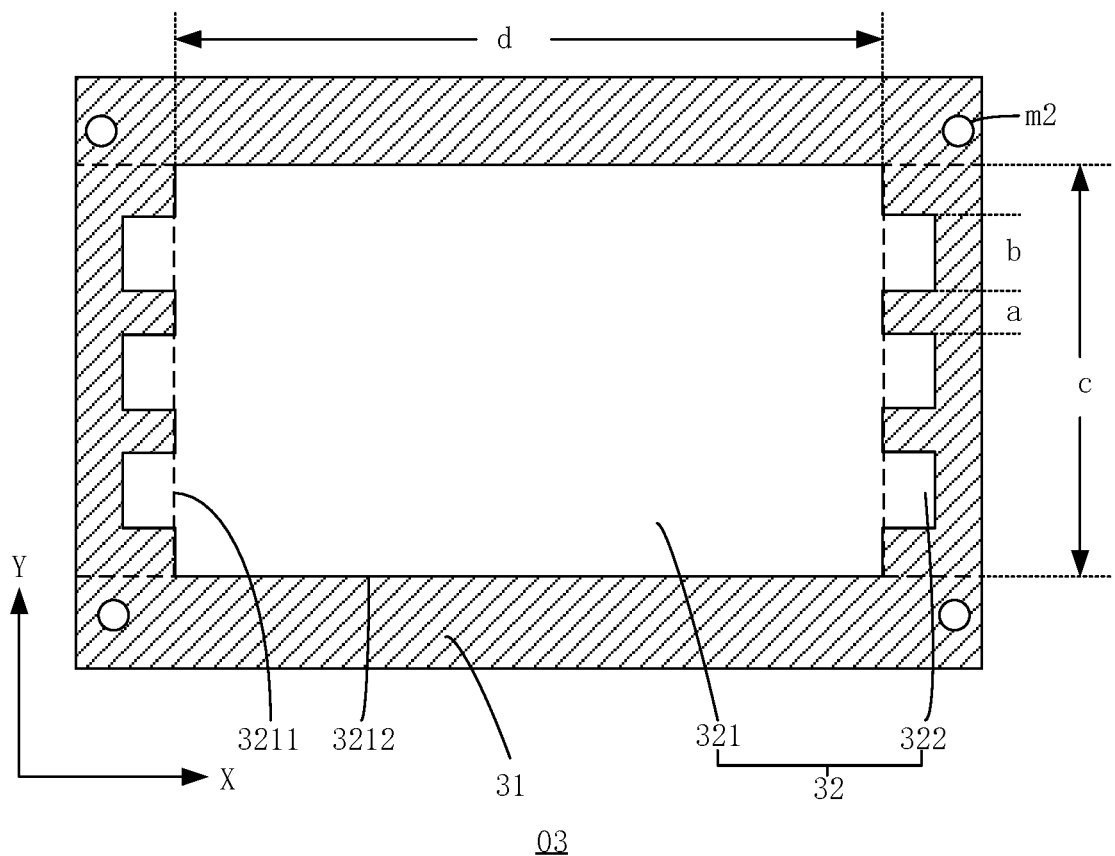
FIG. 3 is a top view of a mask according to a first embodiment of the present disclosure.

FIG. 2 is a top view of a display area and an overlapping area of a display substrate on a carrier table according to an embodiment of the present disclosure. FIG. 3 is a top view of a mask according to a first embodiment of the present disclosure. As shown in FIG. 2 and FIG. 3, the present disclosure provides a vapor deposition apparatus, which comprises a carrier table 02 and a mask 03.

In this embodiment, the carrier table 02 is configured to carry a display substrate 01. The display substrate 01 comprises a display area 100 and an overlapping area 200 surrounding the display area 100. The overlapping area 200 comprises two first overlapping areas 201 extending in a first direction Y and respectively located at opposite sides of the display area 100, and two second overlapping areas 202 extending in a second direction X and respectively located at other opposite sides of the display area 100. The first direction Y is perpendicular to the second direction X. The two first overlapping areas 201 are located at left and right sides of the display area 100. The two second overlapping areas 202 are located at front and rear sides of the display area 100. The display substrate 01 further comprises a plurality of signal wires (not shown) located in the two first overlapping areas 201 and a plurality of signal wires (not shown) located in one of the second overlapping areas 202. As an example, the second overlapping area 202 located at the front side of the display area 100 is provided with the signal wires and a plurality of bonding terminals (not shown). The bonding terminals are configured to electrically connect an external driving circuit board. The second overlapping area 202 located at the rear side of the display area 100 is not provided with signal wires.

In this embodiment, the signal wires in the first overlapping areas 201 and the second overlapping area 202 are, for example, VSS wires.

In this embodiment, the mask 03 is located above the display substrate 01 and is capable of moving in the first direction Y relative to the display substrate 01. The mask 03 comprises a solid portion 31 and a hollow portion 32. During a vapor deposition process, the solid portion 31 can block a film-forming material, and the film-forming material can pass through the hollow portion 32 and form a film on the display substrate 01 below the hollow portion 32.

In this embodiment, the vapor deposition apparatus further comprises an alignment system. The alignment system controls the mask 03 to move in the first direction Y relative to the display substrate 01. The display substrate 01 further comprises a first alignment mark (glass mark) m1. The mask 03 further comprises a second alignment mark (mask mark) m2. The alignment system comprises an alignment camera. The alignment camera can capture relative positions of the first alignment mark m1 and the second alignment mark m2. The alignment system controls a moving distance of the mask plate 03 in the first direction Y by comparing a relative distance between the first alignment mark m1 and the second alignment mark m2. A maximum distance that the mask 03 moves relative to the display substrate 01 in the first direction Y does not exceed a field of view of the alignment camera.

In this embodiment, the hollow portion 32 comprises a first hollow portion 321 and a plurality of second hollow portions 322. The second hollow portions 322 are spaced in the first direction Y on opposite sides of the first hollow portion 321. Each of the second hollow portions 322 communicates with the first hollow portion 321. The mask 03 has a first state before moving and a second state after moving.

In the first state and the second state, an orthographic projection of the first hollow portion 321 on the display substrate 01 always covers the display area 100, and an orthographic projection of the second hollow portions 322 on the display substrate 01 is always located in the first overlapping areas 201. Furthermore, the orthographic projection of the second hollow portions 322 on the display substrate 01 in the second state does not overlap at least partially with the orthographic projection of the second hollow portions 322 on the display substrate 01 in the first state. Therefore, a film formed of one film-forming material in the first overlapping areas 201 in the second state can avoid a part of a film formed of another film-forming material in the first overlapping areas 201 in the first state, so that the film formed of the one film-forming material in the first overlapping areas 201 in the second state can overlap the signal wires located in the first overlapping areas 201.

In this embodiment, in the first state, a film layer formed on the display substrate 01 by the vapor deposition apparatus is a first film layer. In the second state, a film layer formed on the display substrate 01 by the vapor deposition apparatus is a second film layer. As an example, the first film layer is the light-emitting functional layer, and the second film layer is the electrode layer. Furthermore, the electrode layer is a cathode layer.

In this embodiment, the second hollow portions 322 corresponding to the first overlapping areas 201 are arranged at intervals in the first direction Y. Correspondingly, in a subsequent film-forming process, patterns of the light-emitting functional layer and the electrode layer formed in the first overlapping areas 201 are also arranged at intervals in the first direction Y. Therefore, a width of the two first overlapping areas 201 in the second direction X may be designed to be narrower, so as to realize a narrow frame.

No matter in the first state or the second state, the orthographic projection of the first hollow portion 321 of the mask 03 provided by the present disclosure on the display substrate 01 always covers the display area 100. Therefore, the light-emitting functional layer formed by vapor deposition in the first state and the electrode layer formed by vapor deposition in the second state can completely cover the display area 100, so that a complete pixel structure is formed in the display area 100.

In the second state, the orthographic projection of the second hollow portions 322 of the mask 03 provided by the present disclosure on the display substrate 01 is located in the first overlapping areas 201, and the second hollow portions 322 communicate with the first hollow portion 321. Therefore, in the second state, the electrode layer formed by vapor deposition in the first overlapping areas 201 is connected to the electrode layer formed by vapor deposition in the display area 100, so that the electrode layer in the display area 100 is electrically connected to the electrode layer in the first overlapping areas 201.

In the first state and the second state, the orthographic projection of the second hollow portions 322 of the mask 03 provided by the present disclosure on the display substrate 01 is always located in the first overlapping areas 201. Further, the orthographic projection of the second hollow portions 322 on the display substrate 01 in the second state does not overlap at least partially with the orthographic projection of the second hollow portions 322 on the display substrate 01 in the first state. Therefore, an orthographic projection of the electrode layer formed by vapor deposition in the first overlapping areas 201 in the second state on the display substrate 01 does not overlap at least partially with an orthographic projection of the light-emitting functional layer formed by vapor deposition in the first overlapping areas 201 in the first state on the display substrate 01, so that the conductive electrode layer located in the first overlapping areas 201 can avoid at least part of the insulating light-emitting functional layer located in the first overlapping areas 201. This provides a structural basis for connecting the electrode layer in the first overlapping areas 201 and the signal wires in the first overlapping areas 201, thereby normally conducting the signal wires in the first overlapping areas 201 and the electrode layer in the display area 100.

In this embodiment, the second hollow portions 322 in one of the first overlapping areas 201 are symmetrical to the second hollow portions 322 in the other first overlapping area 201. Because the second hollow portions 322 in the first overlapping areas 201 located at the opposite sides of the display area 100 are symmetrically arranged, the signal wires in the two first overlapping areas 201 respectively located at the opposite sides of the display area 100 of the display substrate 01 may also be symmetrically arranged, so as to optimize a structural layout in the overlapping area 200 of the display substrate 01.

In this embodiment, the second hollow portions 322 have a same shape and area. In one same first overlapping area 201, a distance between two adjacent hollow portions 322 is a certain value. That is, in the same first overlapping area 201, the second hollow portions 322 are arranged at equal intervals. Because the second hollow portions 322 are arranged at equal intervals in the same first overlapping area 201, in the same first overlapping area 201, connection points between the signal wires and the electrode layer are also arranged at equal intervals, which further optimizes the structural layout in the overlapping area 200 of the display substrate 01.

In this embodiment, in the same first overlapping area 201, a distance between two adjacent second hollow portions 322 is a, a width of each of the second hollow portions 322 in the first direction Y is b, a moving distance of the mask 03 relative to the display substrate 01 in the first direction Y in the second state is equal to a, and b>a>0. That is, in the second state, a distance that the mask 03 moves relative to the display substrate 01 in the first direction Y is equal to the distance between two adjacent second hollow portions 322. Because the distance that the mask 03 moves relative to the display substrate 01 in the first direction Y in the second state is equal to a, in the subsequent film-forming process, an orthographic projection of the electrode layer on the light-emitting functional layer covers gaps of the light-emitting functional layer in the first overlapping areas 201, which maximizes an overlapping area of the electrode layer in the first overlapping areas 201, thereby ensuring a connection quality between the signal wires and the electrode layer in the first overlapping areas 201.

In this embodiment, a width of the first hollow portion 321 in the first direction Y is c. A width of the first hollow portion 321 in the second direction X is d. A width of the display area 100 in the first direction Y is e. That is, a distance between the two second overlapping areas 202 is e. A width of the display area 100 in the second direction X is f. That is, a distance between the two first overlapping areas 201 is f. Among them, c>e>0, and d=f>0.

In this embodiment, the first hollow portion 321 is shaped as a rectangle. The first hollow portion 321 comprises two first edges 3211 extending in the first direction Y and arranged oppositely, and two second edges 3212 extending in the second direction X and arranged oppositely. Correspondingly, a length of the first edges 3211 is c, and a length of the second edges 3212 is d. The display area 100 is shaped as a rectangle. The display area 100 comprises two third edges 1001 extending in the first direction Y and arranged oppositely, and two fourth edges 1002 extending in the second direction X and arranged oppositely. Correspondingly, a length of the third edges 1001 is e, and a length of the fourth edges 1002 is f.

In the first state, in a direction perpendicular to the display substrate 01, the two first edges 3211 of the first hollow portion 321 are disposed corresponding to the two third edges 1001 of the display area 100, one of the second edges 3212 of the first hollow portion 321 is disposed corresponding to one of the fourth edges 1002 of the display area 100, and the fourth edge 1002 disposed corresponding to the second edge 3212 is disposed adjacent to the second overlapping area 202 where the signal wires are disposed. Because the length of the first edges 3211 is greater than the length of the third edges 1001, the orthographic projection of the first hollow portion 321 on the display substrate 01 comprises a protruding portion located in the second overlapping area 202 where the signal wires are not disposed. A width of the protruding portion in the first direction Y is equal to c−e. A width of the protruding portion in the second direction X is equal to d and f. Correspondingly, the light-emitting functional layer formed in the first state covers the display area 100 and comprises an ineffective light-emitting portion in the second overlapping area 202 where the signal wires are not disposed.

In the second state, the mask 03 moves relative to the display substrate 01 in the first direction Y, the moving distance is a, and c−e=a. At this time, in the direction perpendicular to the display substrate 01, the two first edges 3211 of the first hollow portion 321 are still disposed corresponding to the two third edges 1001 of the display area 100, one of the second edges 3212 of the first hollow portion 321 is disposed corresponding to one of the fourth edges 1002 of the display area 100, and the fourth edge 1002 disposed corresponding to the second edge 3212 is disposed adjacent to the second overlapping area 202 where the signal wires are not disposed. Because the length of the first edges 3211 is greater than the length of the third edges 1001, the orthographic projection of the first hollow portion 321 on the display substrate 01 comprises a protruding portion located in the second overlapping area 202 where the signal wires are disposed. A width of the protruding portion in the first direction Y is equal to c−e. A width of the protruding portion in the second direction X is equal to d and f. Correspondingly, the electrode layer formed in the second state covers the display area 100 and comprises an electrode structure in the second overlapping area 202 where the signal wires are disposed. The electrode structure can be electrically connected to the signal wires in the second overlapping area 202, thereby further improving the uniformity of the display substrate 01.

In this embodiment, in the second state, the moving distance of the mask 03 relative to the display substrate 01 in the first direction Y is equal to the width of the protruding portion in the first direction Y. That is, c−e=a. This structure can reduce a material cost and narrow upper and lower frames as much as possible while ensuring an overlapping effect and a display quality, so as to realize a narrow frame.

In another aspect, the present disclosure further provides a display substrate having a display function. The display substrate is an OLED display substrate.

Figure 4:
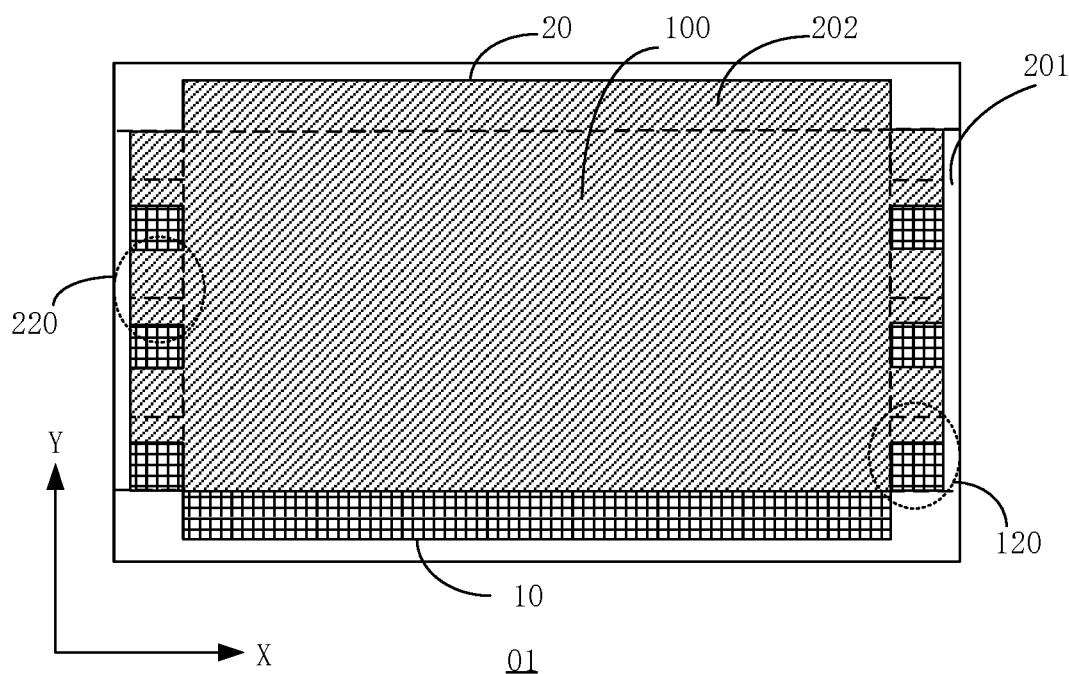
FIG. 4 is a top view of a light-emitting functional layer and an electrode layer of a display substrate according to the first embodiment of the present disclosure.
Figure 5:
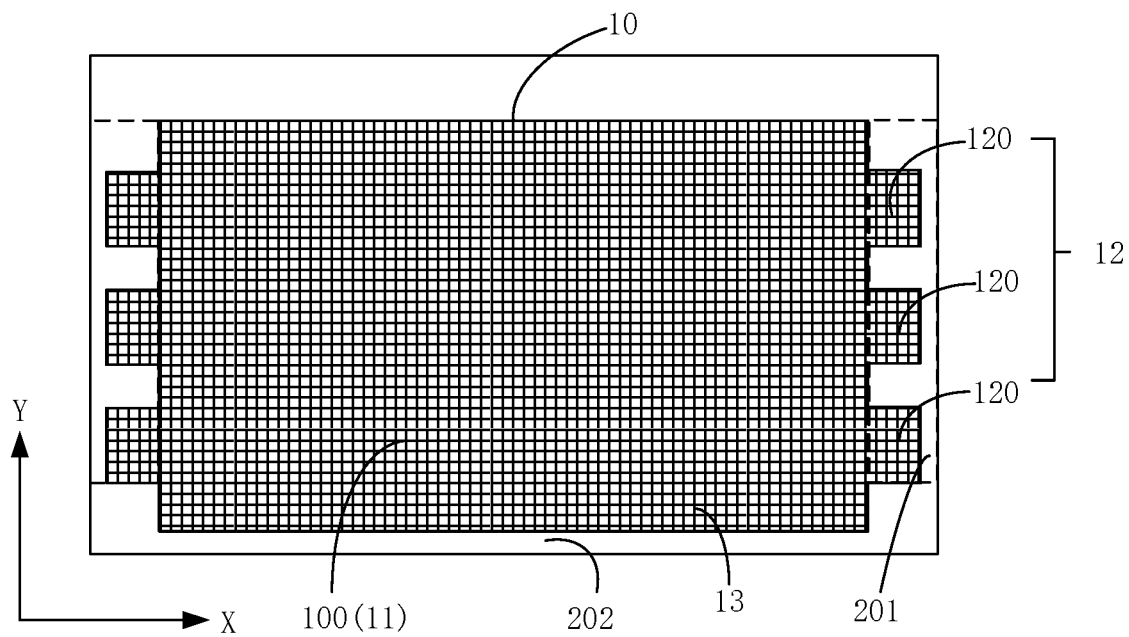
FIG. 5 is a top view of the light-emitting functional layer according to the first embodiment of the present disclosure.
Figure 6:
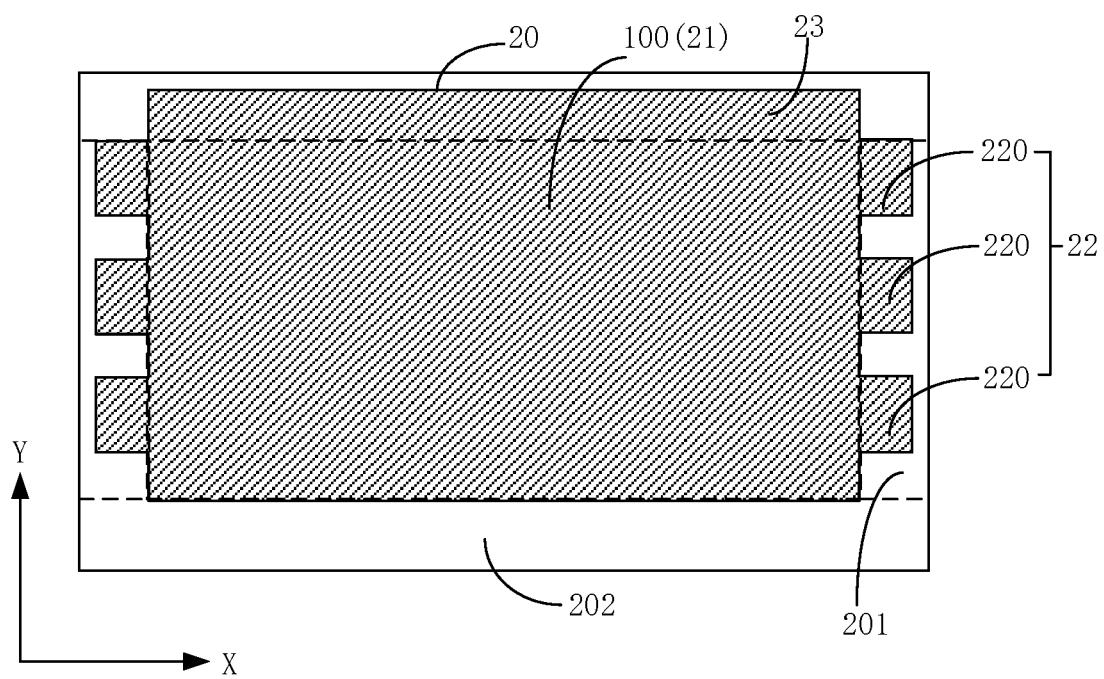
FIG. 6 is a top view of the electrode layer according to the first embodiment of the present disclosure.

FIG. 4 is a top view of a light-emitting functional layer and an electrode layer of a display substrate according to the first embodiment of the present disclosure. FIG. 5 is a top view of the light-emitting functional layer according to the first embodiment of the present disclosure. FIG. 6 is a top view of the electrode layer according to the first embodiment of the present disclosure. As shown in FIG. 2 to FIG. 6, a display substrate 01 comprises a display area 100 and an overlapping area 200 surrounding the display area 100. The overlapping area 200 comprises two first overlapping areas 201 extending in a first direction Y and respectively located at opposite sides of the display area 100, and two second overlapping areas 202 extending in a second direction X and respectively located at other opposite sides of the display area 100. The display substrate 01 further comprises a base substrate and a light-emitting functional layer 10 and an electrode layer 20 stacked on the base substrate. The first direction Y is perpendicular to the second direction X.

The light-emitting functional layer 10 comprises a first portion 11 corresponding to the display area 100 and two second portions 12 corresponding to the two first overlapping areas 201. Each of the second portions 12 comprises a plurality of first blocks 120 spaced in the first direction Y. Each of the first blocks 120 is connected to the first portion 11. The electrode layer 20 comprises a third portion 21 corresponding to the display area 100 and two fourth portions 22 corresponding to the two first overlapping areas 201. Each of the fourth portions 22 comprises a plurality of second blocks 220 spaced in the first direction Y. Each of the second blocks 220 is connected to the third portion 21.

In one same first overlapping area 201, an orthographic projection of each of the first blocks 120 on the base substrate does not overlap at least partially with an orthographic projection of one of the second blocks 220 on the base substrate, and each of the second blocks 220 corresponds to and is electrically connected to an end of one of signal wires.

In this embodiment, a driving circuit layer (not shown) is further disposed between the base substrate and the light-emitting functional layer 10. The driving circuit layer comprises a plurality of the signal wires for transmitting electrical signals located in the two first overlapping areas 201 and one of the second overlapping areas 202. The signal wires are, for example, VSS wires.

In this embodiment, the two second overlapping areas 202 are located at front and rear sides of the display area 100. The second overlapping area 202 provided with the signal wires is located at the front side of the display area 100. The second overlapping area 202 without the signal wires is located at the rear side of the display area 100. In the display substrate 01 provided by the present disclosure, each of the first overlapping areas 201 is provided with a plurality of the first blocks 120 arranged at intervals. And, in the same first overlapping area 201, the orthographic projection of each of the first blocks 120 on the base substrate does not overlap at least partially with the orthographic projection of one of the second blocks 220 on the base substrate. Therefore, the second blocks 220 can electrically connect the signal wires located in the first overlapping areas 201 and the third portion 21 located in the display area 100, so that electrical signals can be uniformly transmitted from left and right sides of the display substrate 01 to the third portion 21 located in the display area 100. This ensures display uniformity of the display substrate 01. Furthermore, in the same first overlapping area 201, each of the second blocks 220 corresponds to and is electrically connected to one end of one of the signal wires.

In this embodiment, in the same first overlapping area 201, an area of the orthographic projection of each of the first blocks 120 on the base substrate is same as an area of the orthographic projection of one of the second blocks 220 on the base substrate, and the number of the first blocks 120 is same as the number of the second blocks 220. In an actual process of fabricating the display substrate 01, the first blocks 120 and the second blocks 220 are fabricated by using the same mask 03. Because a hollow pattern of the mask 03 is fixed, in the same first overlapping area 201, orthographic projections of the first blocks 120 on the base substrate and orthographic projections of the second blocks 220 on the base substrate have a same shape, area, and number.

In this embodiment, the first blocks 120 in one of the first overlapping areas 201 are symmetrical to the first blocks 120 in the other first overlapping area 201. The second blocks 220 in one of the first overlapping areas 201 are symmetrical to the second blocks 220 in the other first overlapping area 201.

In this embodiment, in the same first overlapping area 201, a distance between two adjacent first blocks 120 is a, a distance between two adjacent second blocks 220 is a, and a>0. That is, in the same first overlapping area 201, a width of a gap between two adjacent first blocks 120 is a, and a width of a gap between two adjacent second blocks 220 is also a.

In this embodiment, a width of each of the first blocks 120 in the first direction Y is b, a width of each of the second blocks 220 in the first direction Y is b, and b>a>0.

In this embodiment, an orthographic projection of each of the second blocks 220 on the light-emitting functional layer 10 covers one gap between two adjacent first blocks 120. Because the orthographic projection of each of the second blocks 220 on the light-emitting functional layer 10 covers one gap between two adjacent first blocks 120, an overlapping area of the electrode layer 20 in the first overlapping areas 201 is maximized, thereby ensuring a connection quality between the second blocks 220 and connection ends of the signal wires in the first overlapping areas 201, and ensuring an effect of transmitting electrical signals.

In this embodiment, the light-emitting functional layer 10 further comprises a fifth portion 13 corresponding to one second overlapping area 202. The fifth portion 13 is connected to the first portion 11. The electrode layer 20 further comprises a sixth portion 23 corresponding to one second overlapping area 202. The sixth portion 23 is connected to the third portion 21. The fifth portion 13 and the sixth portion 23 are respectively located in different second overlapping areas 202. Furthermore, the sixth portion 23 is disposed corresponding to the second overlapping area 202 where the signal wires are disposed. The sixth portion 23 electrically connects the signal wires in the second overlapping area 202 to the third portion 21 in the display area 100, so that the electrical signals can be transmitted from a front side of the display substrate 01 into the third portion 21 in the display area 100.

In another aspect, the present disclosure further provides a method for fabricating a display substrate 01, which comprises the following steps:

providing a vapor deposition apparatus, wherein the vapor deposition apparatus comprises a carrier table 02 and a mask 03, the mask 03 comprises a solid portion 31 and a hollow portion 32, the hollow portion 32 comprises a first hollow portion 321 and a plurality of second hollow portions 322 spaced in a first direction Y on opposite sides of the first hollow portion 321, and each of the second hollow portions 322 communicates with the first hollow portion 321;

disposing a display substrate 01 on the carrier table 02, wherein the display substrate 01 comprises a display area 100 and an overlapping area 200 surrounding the display area 100, the overlapping area 200 comprises two first overlapping areas 201 extending in the first direction Y and respectively located on opposite sides of the display area 100, and each of the first overlapping areas 201 is provided with a plurality of signal wires;

disposing the mask 03 above the display substrate 01, adjusting the mask 03 to a first state, and forming a patterned light-emitting functional layer 10 on the display substrate 01 by using the mask 03, wherein in the first state, an orthographic projection of the first hollow portion 321 on the display substrate 01 covers the display area 100, and an orthographic projection of the second hollow portions 322 on the display substrate 01 is located in the first overlapping areas 201;

moving the mask 03 in the first direction Y relative to the display substrate 01 to adjust the mask 03 from the first state to a second state, and forming a patterned electrode layer 20 on the display substrate 01 by using the mask 03, wherein in the second state, an orthographic projection of the first hollow portion 321 on the display substrate 01 covers the display area 100, and an orthographic projection of the second hollow portions 322 on the display substrate 01 is located in the first overlapping areas 201, and the orthographic projection of the second hollow portions 322 on the display substrate 01 in the second state does not overlap at least partially with the orthographic projection of the second hollow portions 322 on the display substrate 01 in the first state.

Second Embodiment

Figure 7:
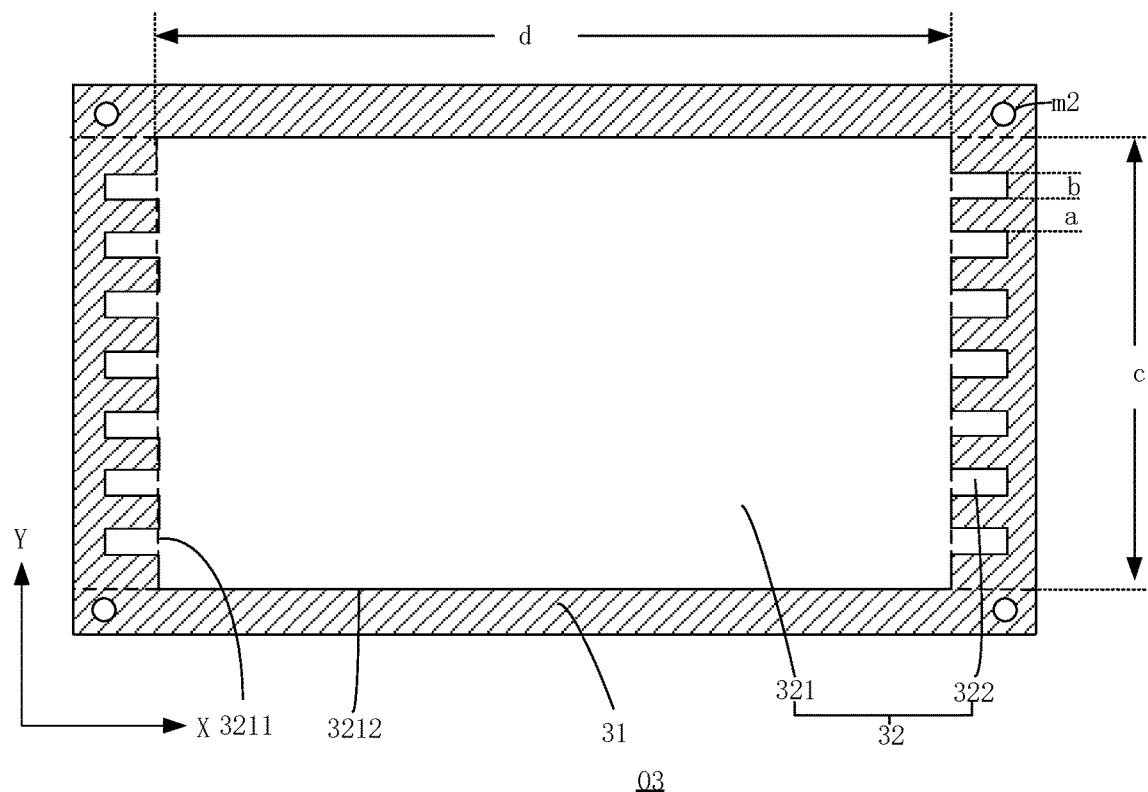
FIG. 7 is a top view of a mask according to a second embodiment of the present disclosure.

FIG. 7 is a top view of a mask according to a second embodiment of the present disclosure. Please refer to FIG. 2 and FIG. 7, the second embodiment of the present disclosure provides a vapor deposition apparatus, which is similar to the vapor deposition apparatus of the first embodiment. Specifically, the vapor deposition apparatus comprises a carrier table 02 and a mask 03. The carrier table 02 is configured to carry a display substrate 01. The display substrate 01 comprises a display area 100 and an overlapping area 200 surrounding the display area 100. The overlapping area 200 comprises two first overlapping areas 201 extending in a first direction Y and respectively located on opposite sides of the display area 100. The mask 03 is located above the display substrate 01 and is capable of moving in the first direction Y relative to the display substrate 01. The mask 03 comprises a solid portion 31 and a hollow portion 32. The hollow portion 32 comprises a first hollow portion 321 and a plurality of second hollow portions 322. The second hollow portions 322 are spaced in the first direction Y on opposite sides of the first hollow portion 321. Each of the second hollow portions 322 communicates with the first hollow portion 321. The mask 03 has a first state before moving and a second state after moving. In the first state and the second state, an orthographic projection of the first hollow portion 321 on the display substrate 01 always covers the display area 100, and an orthographic projection of the second hollow portions 322 on the display substrate 01 is always located in the first overlapping areas 201.

The vapor deposition apparatus of this embodiment is similar to the vapor deposition apparatus of the first embodiment, and same parts will not be described herein.

The difference is that the orthographic projection of the second hollow portions 322 on the display substrate 01 in the second state does not overlap with the orthographic projection of the second hollow portions 322 on the display substrate 01 in the first state.

Specifically, in one same first overlapping area 201, a distance between two adjacent second hollow portions 322 is a, a width of each of the second hollow portions 322 in the first direction Y is b, a moving distance of the mask 03 relative to the display substrate 01 in the first direction Y in the second state is equal to b, and 0<b≤a. Preferably, the distance between two adjacent second hollow portions 322 is equal to the width of each of the second hollow portions 322 in the first direction Y, that is, a=b. In this case, an orthographic projection of each of second blocks 220 on the light-emitting functional layer 10 covers one gap between two adjacent first blocks 120, which maximizes an overlapping area.

In this embodiment, the overlapping area 200 further comprises two second overlapping areas 202 extending in a second direction X and respectively located at other opposite sides of the display area 100. A width of the first hollow portion 321 in the first direction Y is c. A width of the display area 100 in the first direction Y is e. That is, a distance between the two second overlapping areas 202 is e. A difference between c and e is equal to the moving distance of the mask 03 relative to the display substrate 01 in the first direction Y in the second state. That is, c>e>0 and c−e=b.

Figure 8:
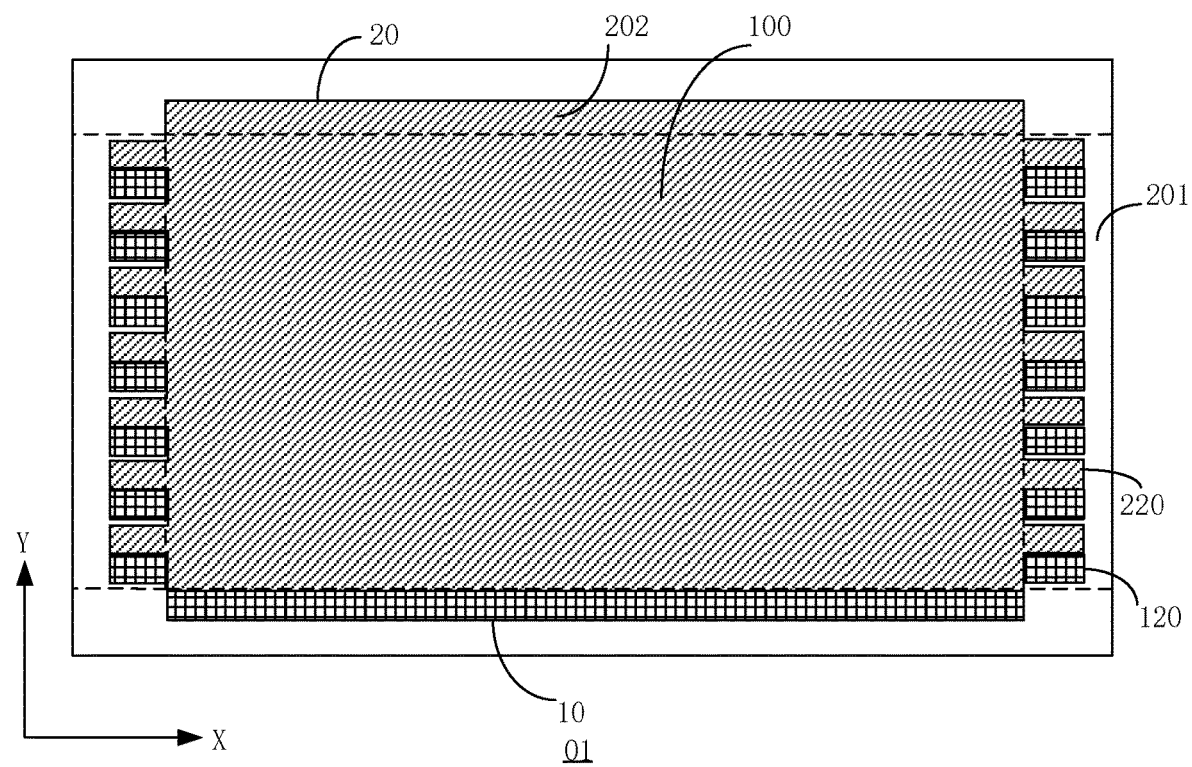
FIG. 8 is a top view of a light-emitting functional layer and an electrode layer of a display substrate according to the second embodiment of the present disclosure.
Figure 9:
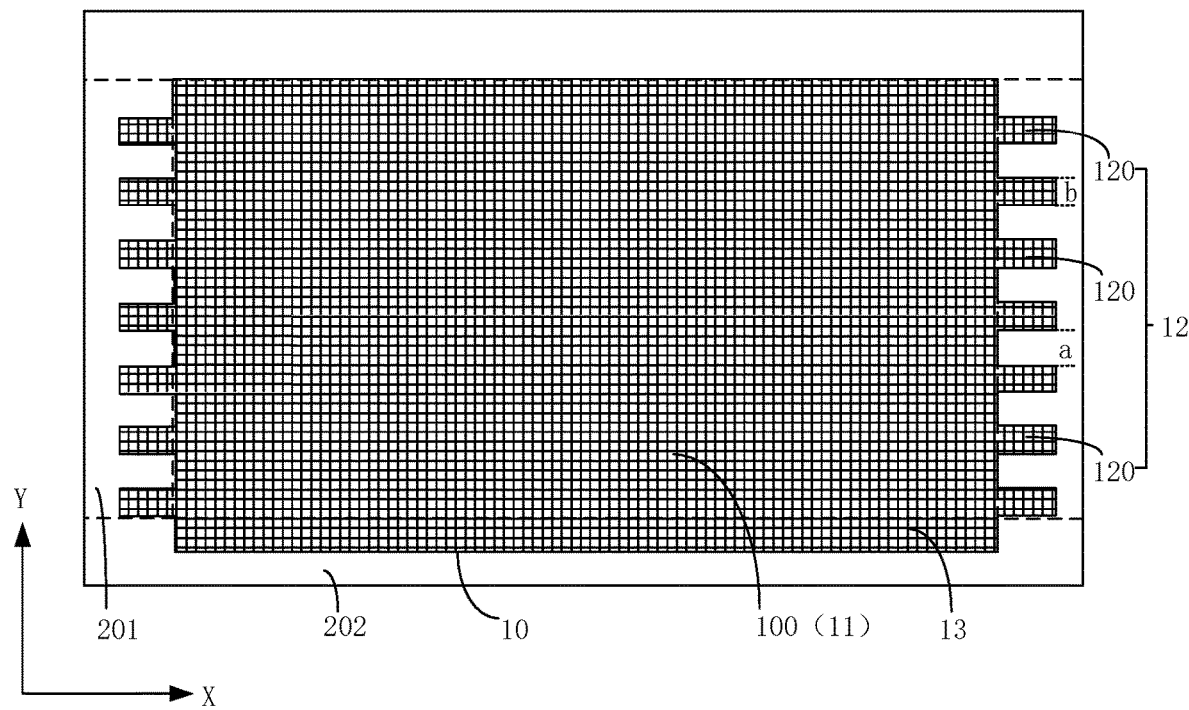
FIG. 9 is a top view of the light-emitting functional layer according to the second embodiment of the present disclosure.
Figure 10:
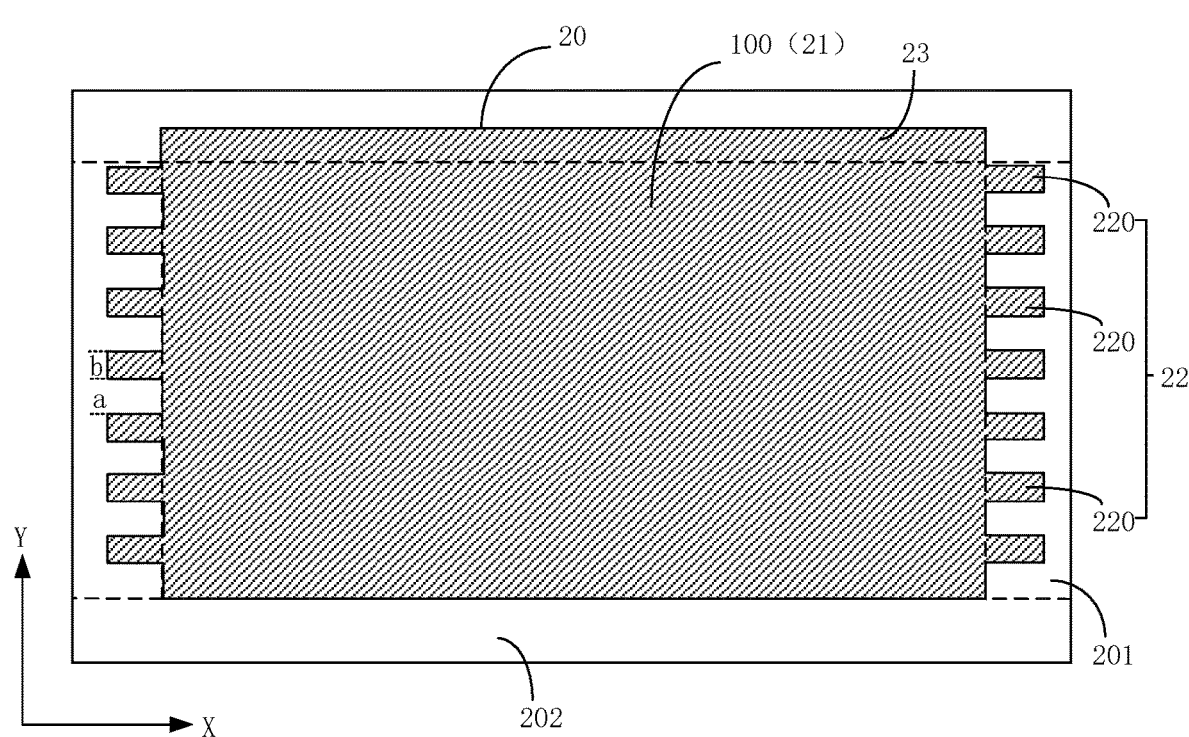
FIG. 10 is a top view of the electrode layer according to the second embodiment of the present disclosure.

In another aspect, the second embodiment of the present disclosure further provides a display substrate having a display function. The display substrate is an OLED display substrate. FIG. 8 is a top view of a light-emitting functional layer and an electrode layer of a display substrate according to the second embodiment of the present disclosure. FIG. 9 is a top view of the light-emitting functional layer according to the second embodiment of the present disclosure. FIG. 10 is a top view of the electrode layer according to the second embodiment of the present disclosure. Please refer to FIG. 2 and FIG. 7 to FIG. 10, a display substrate 01 comprises a display area 100 and an overlapping area 200 surrounding the display area 100. The overlapping area 200 comprises two first overlapping areas 201 extending in a first direction Y and respectively located at opposite sides of the display area 100, and two second overlapping areas 202 extending in a second direction X and respectively located at other opposite sides of the display area 100. The display substrate 01 further comprises a base substrate and a light-emitting functional layer 10 and an electrode layer 20 stacked on the base substrate. The light-emitting functional layer 10 comprises a first portion 11 corresponding to the display area 100 and two second portions 12 corresponding to the two first overlapping areas 201. Each of the second portions 12 comprises a plurality of first blocks 120 spaced in the first direction Y. Each of the first blocks 120 is connected to the first portion 11. The electrode layer 20 comprises a third portion 21 corresponding to the display area 100 and two fourth portions 22 corresponding to the two first overlapping areas 201. Each of the fourth portions 22 comprises a plurality of second blocks 220 spaced in the first direction Y. Each of the second blocks 220 is connected to the third portion 21.

The display substrate 01 of this embodiment is similar to the display substrate 01 of the first embodiment, and same parts will not be described herein.

The difference is that an orthographic projection of each of the first blocks 120 on the base substrate does not overlap with an orthographic projection of one of the second blocks 220 on the base substrate, and each of the second blocks 220 corresponds to and is electrically connected to an end of one of signal wires.

In this embodiment, in the same first overlapping area 201, a distance between two adjacent first blocks 120 is a, a distance between two adjacent second blocks 220 is a, and a>0. That is, in the same first overlapping area 201, a width of a gap between two adjacent first blocks 120 is a, and a width of a gap between two adjacent second blocks 220 is also a.

In this embodiment, a width of each of the first blocks 120 in the first direction Y is b, a width of each of the second blocks 220 in the first direction Y is b, and 0<b≤a. FIG. 9 and FIG. 10 specifically show that b<a.

When b<a, an orthographic projection of each of the second blocks 220 on the display substrate 01 is spaced apart from an orthographic projection of one of the first blocks 120 on the display substrate 01.

When b=a, the orthographic projection of each of the second blocks 220 on the display substrate 01 is adjacent to the orthographic projection of one of the first blocks 120 on the display substrate 01. That is, in the same first overlapping area 201, the width of each of the first blocks 120 in the first direction Y is equal to the distance between two adjacent first blocks 120, and the width of each of the second blocks 220 in the first direction Y is equal to the distance between two adjacent second blocks 220. Therefore, the orthographic projection of each of the second blocks 220 on the light-emitting functional layer 10 covers one gap between two adjacent first blocks 120.

In another aspect, the present disclosure further provides a method for fabricating a display substrate 01, which comprises the following steps:

providing a vapor deposition apparatus, wherein the vapor deposition apparatus comprises a carrier table 02 and a mask 03, the mask 03 comprises a solid portion 31 and a hollow portion 32, the hollow portion 32 comprises a first hollow portion 321 and a plurality of second hollow portions 322 spaced in a first direction Y on opposite sides of the first hollow portion 321, and each of the second hollow portions 322 communicates with the first hollow portion 321;

disposing a display substrate 01 on the carrier table 02, wherein the display substrate 01 comprises a display area 100 and an overlapping area 200 surrounding the display area 100, the overlapping area 200 comprises two first overlapping areas 201 extending in the first direction Y and respectively located on opposite sides of the display area 100, and each of the first overlapping areas 201 is provided with a plurality of signal wires;

disposing the mask 03 above the display substrate 01, adjusting the mask 03 to a first state, and forming a patterned light-emitting functional layer 10 on the display substrate 01 by using the mask 03, wherein in the first state, an orthographic projection of the first hollow portion 321 on the display substrate 01 covers the display area 100, and an orthographic projection of the second hollow portions 322 on the display substrate 01 is located in the first overlapping areas 201;

moving the mask 03 in the first direction Y relative to the display substrate 01 to adjust the mask 03 from the first state to a second state, and forming a patterned electrode layer 20 on the display substrate 01 by using the mask 03, wherein in the second state, an orthographic projection of the first hollow portion 321 on the display substrate 01 covers the display area 100, and an orthographic projection of the second hollow portions 322 on the display substrate 01 is located in the first overlapping areas 201, and the orthographic projection of the second hollow portions 322 on the display substrate 01 in the second state does not overlap with the orthographic projection of the second hollow portions 322 on the display substrate 01 in the first state.

In the above, the present disclosure provides a display substrate, a method for fabricating the same, and a vapor deposition apparatus. The display substrate comprises a display area and an overlapping area surrounding the display area, and further comprises a base substrate and a light-emitting functional layer and an electrode layer stacked on the base substrate. The overlapping area comprises two first overlapping areas. The two first overlapping areas extend in a first direction and are respectively located at opposite sides of the display area. Each of the first overlapping areas is provided with a plurality of signal wires. The light-emitting functional layer comprises a first portion located in the display area and two second portions respectively located in the two first overlapping areas. Each of the second portions comprises a plurality of first blocks spaced in the first direction. Each of the first blocks is connected to the first portion. The electrode layer comprises a third portion located in the display area and two fourth portions respectively located in the two first overlapping areas. Each of the fourth portions comprises a plurality of second blocks spaced in the first direction. Each of the second blocks is connected to the third portion. In one same first overlapping area, an orthographic projection of each of the first blocks on the base substrate does not overlap at least partially with an orthographic projection of one of the second blocks on the base substrate, and each of the second blocks corresponds to and is electrically connected to an end of one of the signal wires. The light-emitting functional layer and the electrode layer of the display substrate provided by the present disclosure can be formed by using one same mask in the vapor deposition apparatus, thereby simplifying a manufacturing process and reducing a manufacturing cost.

The display substrate, the method for fabricating the same, and the vapor deposition apparatus provided by the embodiments of the present disclosure are described in detail above. The present disclosure uses specific examples to describe principles and embodiments of the present invention. The above description of the embodiments is only for helping to understand the present invention. Furthermore, those skilled in the art may make modifications to the specific embodiments and applications according to ideas of the present invention. In conclusion, the present specification should not be construed as a limitation to the present invention.

What is claimed is:

1. A display substrate, comprising a display area and an overlapping area surrounding the display area, and further comprising a base substrate and a light-emitting functional layer and an electrode layer stacked on the base substrate, wherein
   the overlapping area comprises two first overlapping areas, the two first overlapping areas extend in a first direction and are respectively located at opposite sides of the display area, and each of the first overlapping areas is provided with a plurality of signal wires;
   the light-emitting functional layer comprises a first portion located in the display area and two second portions respectively located in the two first overlapping areas, each of the second portions comprises a plurality of first blocks spaced in the first direction, and each of the first blocks is connected to the first portion;
   the electrode layer comprises a third portion located in the display area and two fourth portions respectively located in the two first overlapping areas, each of the fourth portions comprises a plurality of second blocks spaced in the first direction, and each of the second blocks is connected to the third portion; and
   in one same first overlapping area, an orthographic projection of each of the first blocks on the base substrate does not overlap at least partially with an orthographic projection of one of the second blocks on the base substrate, and each of the second blocks corresponds to and is electrically connected to an end of one of the signal wires.

2. The display substrate according to claim 1, wherein in the same first overlapping area, an area of the orthographic projection of each of the first blocks on the base substrate is same as an area of the orthographic projection of one of the second blocks on the base substrate, and a number of the first blocks is same as a number of the second blocks.

3. The display substrate according to claim 1, wherein the first blocks in one of the first overlapping areas are symmetrical to the first blocks in the other first overlapping area, and the second blocks in one of the first overlapping areas are symmetrical to the second blocks in the other first overlapping area.

4. The display substrate according to claim 3, wherein in the same first overlapping area, a distance between two adjacent first blocks is a, a distance between two adjacent second blocks is a, a width of each of the first blocks in the first direction is b, a width of each of the second blocks in the first direction is b, an orthographic projection of each of the second blocks on the light-emitting functional layer covers a gap between two adjacent first blocks, and b≥a>0.

5. The display substrate according to claim 1, wherein the overlapping area further comprises two second overlapping areas, the two second overlapping areas extend in a second direction and are respectively located at other opposite sides of the display area, the light-emitting functional layer further comprises a fifth portion corresponding to one second overlapping area and connected to the first portion, the electrode layer further comprises a sixth portion corresponding to one second overlapping area and connected to the third portion, the fifth portion and the sixth portion are respectively located in different second overlapping areas, and the first direction is perpendicular to the second direction.

6. The display substrate according to claim 5, wherein the second overlapping area provided with the sixth portion is further provided with a plurality of signal wires.

7. The display substrate according to claim 1, wherein the signal wires are VSS wires.

8. The display substrate according to claim 7, wherein in the same first overlapping area, an area of the orthographic projection of each of the first blocks on the base substrate is same as an area of the orthographic projection of one of the second blocks on the base substrate, and a number of the first blocks is same as a number of the second blocks.

9. The display substrate according to claim 7, wherein the first blocks in one of the first overlapping areas are symmetrical to the first blocks in the other first overlapping area, and the second blocks in one of the first overlapping areas are symmetrical to the second blocks in the other first overlapping area.

10. The display substrate according to claim 9, wherein in the same first overlapping area, a distance between two adjacent first blocks is a, a distance between two adjacent second blocks is a, a width of each of the first blocks in the first direction is b, a width of each of the second blocks in the first direction is b, an orthographic projection of each of the second blocks on the light-emitting functional layer covers a gap between two adjacent first blocks, and b≤a>0.

11. The display substrate according to claim 7, wherein the overlapping area further comprises two second overlapping areas, the two second overlapping areas extend in a second direction and are respectively located at other opposite sides of the display area, the light-emitting functional layer further comprises a fifth portion corresponding to one second overlapping area and connected to the first portion, the electrode layer further comprises a sixth portion corresponding to one second overlapping area and connected to the third portion, the fifth portion and the sixth portion are respectively located in different second overlapping areas, and the first direction is perpendicular to the second direction.

12. The display substrate according to claim 11, wherein the second overlapping area provided with the sixth portion is further provided with a plurality of signal wires, and a type of the signal wires in the second overlapping area is same as a type of the signal wires in the first overlapping areas.

13. A vapor deposition apparatus, comprising:
a carrier table configured to carry a display substrate, wherein the display substrate comprises a display area and an overlapping area surrounding the display area, the overlapping area comprises two first overlapping areas, the two first overlapping areas extend in a first direction and are respectively located at opposite sides of the display area, and each of the first overlapping areas is provided with a plurality of signal wires; and
a mask located above the display substrate, capable of moving in the first direction relative to the display substrate, and comprising a solid portion and a hollow portion, wherein the hollow portion comprises a first hollow portion and a plurality of second hollow portions spaced in the first direction on opposite sides of the first hollow portion, and each of the second hollow portions communicates with the first hollow portion;
wherein the mask has a first state before moving and a second state after moving, in the first state and the second state, an orthographic projection of the first hollow portion on the display substrate always covers the display area, and an orthographic projection of the second hollow portions on the display substrate is always located in the first overlapping areas, and the orthographic projection of the second hollow portions on the display substrate in the second state does not overlap at least partially with the orthographic projection of the second hollow portions on the display substrate in the first state.

14. The vapor deposition apparatus according to claim 13, wherein the second hollow portions located on one side of the first hollow portion are symmetrical to the second hollow portions located on the other side of the first hollow portion.

15. The vapor deposition apparatus according to claim 14, wherein on a side of the first hollow portion, the second hollow portions are arranged at equal intervals.

16. The vapor deposition apparatus according to claim 15, wherein in the same first overlapping area, a distance between orthographic projections of two adjacent second hollow portions is a, a width of an orthographic projection of each of the second hollow portions in the first direction is b, a moving distance of the mask relative to the display substrate in the first direction in the second state is equal to a, and b>a>0.

17. The vapor deposition apparatus according to claim 16, wherein the overlapping area further comprises two second overlapping areas, the two second overlapping areas extend in a second direction and are respectively located at other opposite sides of the display area, a width of the first hollow portion in the first direction is c, a width of the display area in the first direction is e, a difference between c and e is equal to the moving distance of the mask relative to the display substrate in the first direction in the second state, and c>e>0.

18. The vapor deposition apparatus according to claim 15, wherein in the same first overlapping area, a distance between orthographic projections of two adjacent second hollow portions is a, a width of an orthographic projection of each of the second hollow portions in the first direction is b, a moving distance of the mask relative to the display substrate in the first direction in the second state is equal to b, and 0<b≤a.

19. The vapor deposition apparatus according to claim 18, wherein the overlapping area further comprises two second overlapping areas, the two second overlapping areas extend in a second direction and are respectively located at other opposite sides of the display area, a width of the first hollow portion in the first direction is c, a width of the display area in the first direction is e, a difference between c and e is equal to the moving distance of the mask relative to the display substrate in the first direction in the second state, and c>e>0.

20. A method for fabricating a display substrate, comprising:
providing a vapor deposition apparatus, wherein the vapor deposition apparatus comprises a carrier table and a mask, the mask comprises a solid portion and a hollow portion, the hollow portion comprises a first hollow portion and a plurality of second hollow portions spaced in a first direction on opposite sides of the first hollow portion, and each of the second hollow portions communicates with the first hollow portion;
disposing a display substrate on the carrier table, wherein the display substrate comprises a display area and an overlapping area surrounding the display area, the overlapping area comprises two first overlapping areas, the two first overlapping areas extend in the first direction and are respectively located at opposite sides of the display area, and each of the first overlapping areas is provided with a plurality of signal wires;
disposing the mask above the display substrate, adjusting the mask to a first state, and forming a patterned light-emitting functional layer on the display substrate by using the mask, wherein in the first state, an orthographic projection of the first hollow portion on the display substrate covers the display area, and an orthographic projection of the second hollow portions on the display substrate is located in the first overlapping areas;
moving the mask in the first direction relative to the display substrate to adjust the mask from the first state to a second state, and forming a patterned electrode layer on the display substrate by using the mask, wherein in the second state, an orthographic projection of the first hollow portion on the display substrate covers the display area, and an orthographic projection of the second hollow portions on the display substrate is located in the first overlapping areas, and the orthographic projection of the second hollow portions on the display substrate in the second state does not overlap at least partially with the orthographic projection of the second hollow portions on the display substrate in the first state.

* * * * *